(12) United States Patent
Kim et al.

(10) Patent No.: US 8,329,089 B2
(45) Date of Patent: Dec. 11, 2012

(54) METHOD FOR FORMING A RESIST PATTERN

(75) Inventors: Jin Wuk Kim, Uiwang-si (KR); Yeon Heui Nam, Gangneung-si (KR)

(73) Assignee: LG Display Co., Ltd., Seoul (KR)

( * ) Notice: Subject to any disclaimer, the term of this patent is extended or adjusted under 35 U.S.C. 154(b) by 1110 days.

(21) Appl. No.: 11/790,062

(22) Filed: Apr. 23, 2007

(65) Prior Publication Data
US 2007/0246441 A1 Oct. 25, 2007

(30) Foreign Application Priority Data
Apr. 25, 2006 (KR) ................. 2006-036996

(51) Int. Cl.
| | |
|---|---|
| B28B 11/08 | (2006.01) |
| B29C 35/08 | (2006.01) |
| B29C 59/00 | (2006.01) |
| C08B 5/00 | (2006.01) |
| B44C 1/22 | (2006.01) |
| C03C 15/00 | (2006.01) |
| C03C 25/68 | (2006.01) |
| C23F 1/00 | (2006.01) |

(52) U.S. Cl. ............. 264/496; 264/331.11; 264/293; 216/43; 216/44; 216/48

(58) Field of Classification Search ............ None
See application file for complete search history.

(56) References Cited

U.S. PATENT DOCUMENTS

| | | | | |
|---|---|---|---|---|
| 5,425,848 A * | 6/1995 | Haisma et al. | ............ | 216/48 |
| 6,344,495 B1 * | 2/2002 | Ueda et al. | ............ | 522/96 |
| 7,041,604 B2 * | 5/2006 | Miller et al. | ............ | 438/735 |
| 7,122,079 B2 * | 10/2006 | Xu et al. | ............ | 106/287.12 |
| 7,252,862 B2 * | 8/2007 | Jung et al. | ............ | 427/301 |
| 2005/0084613 A1 * | 4/2005 | Wang et al. | ............ | 427/282 |
| 2005/0167894 A1 * | 8/2005 | Shih et al. | ............ | 264/496 |
| 2005/0170282 A1 * | 8/2005 | Inno et al. | ............ | 430/270.1 |
| 2005/0253307 A1 * | 11/2005 | Sreenivasan | ............ | 264/494 |
| 2005/0260522 A1 * | 11/2005 | Weber et al. | ............ | 430/270.1 |
| 2005/0276919 A1 * | 12/2005 | Truskett et al. | ............ | 427/230 |
| 2006/0012889 A1 * | 1/2006 | Kojima et al. | ............ | 359/741 |

(Continued)

FOREIGN PATENT DOCUMENTS

JP 63293546 A * 11/1988

(Continued)

OTHER PUBLICATIONS

Power Chemcial Products, Silane Coupling Agent, May 5, 2002, http://web.archive.org/web/20020505194253/http://www.powerchemical.net/coupling1.htm.*

(Continued)

*Primary Examiner* — Christina Johnson
*Assistant Examiner* — Benjamin Schiffman
(74) *Attorney, Agent, or Firm* — McKenna Long & Aldridge LLP

(57) ABSTRACT

A resist composition used for the imprint lithography process, a method for forming resist pattern using the same, an array substrate manufactured using the same, and method of fabricating the array substrate includes an additive and the adhesion promoter inducing the chemical bond of the base layer contacting to the UV curable resin. As a result, it is possible for the resist composition to form a high-resolution pattern and to improve the durability of the mold for molding a UV curable resin.

5 Claims, 8 Drawing Sheets

U.S. PATENT DOCUMENTS

2006/0046069 A1* 3/2006 Jung et al. .................. 428/429
2006/0257785 A1* 11/2006 Johnson .................. 430/270.1

FOREIGN PATENT DOCUMENTS

| JP | 07005693 A | * | 1/1995 |
| JP | 09043844 A | * | 2/1997 |
| JP | 2000226421 A | * | 8/2000 |
| KR | 10-2006-0029818 | | 4/2006 |
| TW | 200628974 | | 8/2006 |

OTHER PUBLICATIONS

Silane Coupling Agents: Connecting Across Boundaries, Gelest, 2006.*

* cited by examiner

METHOD FOR FORMING A RESIST PATTERN

This application claims the benefit of Korean Patent Application No. 2006-36996 filed on Apr. 25, 2006, which is hereby incorporated by reference for all purposes as if fully set forth herein.

BACKGROUND OF THE INVENTION

1. Field of the Invention

The present invention relates to an imprint lithography process and, more particularly, to a resist composition used for an imprint lithography process, a method for forming a resist pattern using the resist composition, an array substrate manufactured using the same and a method of fabricating the array substrate.

2. Description of the related art

In general, several thin film patterning processes are carried out to manufacture a flat display panel displaying images.

Generally, the film patterning processes are carried out using a photo lithography process. Here, the photo lithography process includes a forming a resist pattern on the thin film using the exposure and development processes, etching the thin film using the resist pattern as an etching mask, and removing the resist pattern from the thin film.

The photo lithography process requires a lot of initial investment cost, because it is performed by expensive equipment. Further, the economic efficiency of the photo lithography process is reduced, because the photo lithography process requires an expensive pattern mask. Furthermore, there is a limit to the detail achieved by the photo lithography process, because of the margin of the pattern width of the pattern mask.

Accordingly, an imprint lithography process that does not use a mask has been developed recently. The imprint lithography process fabricates a resist pattern on a substrate using imprinting, and it has an advantage in that a multitude of fine patterns may be fabricated.

The imprint lithography process includes forming a resist layer on the substrate, imprinting mold patterns on the resist layer by using a mold having a regular pattern, hardening the resist layer having the mold patterns, and separating the mold from the resist layer.

Here, when the adhesive force between the resist layer and the mold is stronger than the adhesive force between the substrate and the resist layer, a defective resist pattern is formed as the resist layer breaks off by adhering to the mold when separating the mold from the resist layer.

Further, the mold is damaged or deformed when the mold is not easily separated from the resist layer. Furthermore, when the mold is separated from the resist layer when a portion of resist layer adheres to the mold, a cleaning step has to be added to remove the portion of the resist layer adhering to the mold. Moreover, when the mold has a nano size pattern, it is more difficult to remove the portion of the resist layer from the mold using the cleaning step, and it leads to the replacement of the mold.

SUMMARY OF THE INVENTION

Accordingly, the present invention is directed to resist composition, method for forming resist pattern using the same, array substrate fabricated using the same and method of fabricating the array substrate that substantially obviates one or more of the problems due to limitations and disadvantages of the related art.

The present invention has an advantage in that the durability of a mold is improved, as it is possible for a mold to be reliably separated from the base layer as an adhesive strength between a base layer and a resist pattern is improved during the imprinting lithography process.

Further, the present invention has an advantage in that it is possible for the resist patterns to be formed with high resolution, because it is possible that the patterns of high-resolution is formed as the mold is separated from the base layer cleanly. Accordingly, it is possible to fabricate an indicating element with a circuit of high integration easily.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a resist composition includes: an UV curable resin and an additive; and an adhesion promoter inducing a chemical bond between the UV curable resin and a base layer in contact with the UV curable resin.

In another aspect of the present invention, a method of forming resist pattern includes: supplying a substrate; forming a resist layer on the substrate; applying a mold with a predetermined pattern to the resist layer; forming a preliminary resist pattern where the pattern of the mold is transcribed onto the resist layer; forming a resist pattern by hardening the preliminary resist pattern; and separating the mold from the resist pattern, wherein the resist layer includes an adhesion promoter that increases an adhesive strength between the substrate and the resist layer.

In another aspect of the present invention, a color filter array substrate includes: a substrate; a black matrix and a color filter pattern formed on the substrate; and an overcoat pattern positioned over the black matrix and the color filter pattern and having a protrusion, wherein the overcoat pattern includes an adhesion promoter increasing an adhesive strength between the overcoat pattern and one of the black matrix and the color filter pattern.

In another aspect of the present invention, a method of forming a color filter array substrate includes: supplying a substrate; forming a black matrix on the substrate; forming a color filter pattern on the substrate on which a black matrix is formed; forming an overcoat layer by applying a composition over the black matrix and the color filter pattern; forming an overcoat pattern with a protrusion corresponding to a mold with a predetermined pattern; and separating the mold from the overcoat pattern, wherein the overcoat pattern includes an adhesion promoter that increases an adhesion strength between the overcoat pattern and at least one of the black matrix and the color filter pattern.

In another aspect of the present invention, a thin film transistor array substrate includes: a substrate; a thin film transistor formed on the substrate; a passivation pattern having a contact hole exposing a part of the thin film transistor; and a pixel electrode electrically connected with the thin film transistor through the contact hole, wherein the passivation pattern includes an adhesion promoter that increases an adhesive strength between the passivation pattern and the substrate.

In another aspect of the present invention, a method of fabricating a thin film transistor array substrate includes: supplying a substrate; forming a thin film transistor on the substrate; forming a passivation layer over the substrate including the thin film transistor; forming a contact hole in the passivation pattern exposing a part of the thin film transistor corresponding a mold with a predetermined pattern; separating a mold from the passivation pattern; and forming a pixel electrode connected with the thin film transistor electrically through the contact hole on the passivation pattern, wherein the passivation layer includes an adhesion promoter that increases an adhesive strength between the passivation pattern and the substrate.

It is to be understood that both the foregoing general description and the following detailed description are exemplary and explanatory and are intended to provide further explanation of the invention as claimed.

DETAILED DESCRIPTION OF THE INVENTION

Reference will now be made in detail to an embodiment of the present invention, example of which is illustrated in the accompanying drawings.

A resist composition, a method for forming resist pattern using the same, an array substrate fabricated using the same, and a method for fabricating an array substrate according to the present invention will now be described.

Figure 1A:
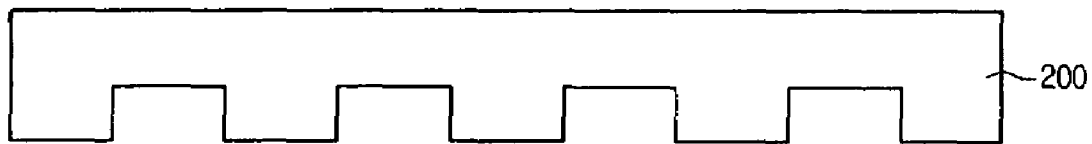
FIGS. 1A to 1D are cross-sectional views illustrating the imprint lithography fabricating process according to the first embodiment of the present invention.
Figure 1A:
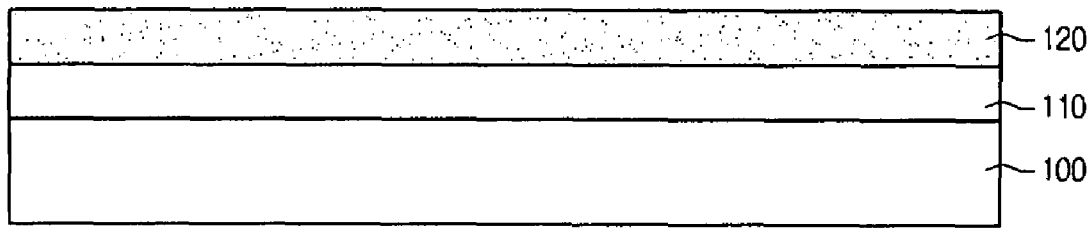

FIGS. 1A to 1D are cross-sectional views illustrating the imprint lithography fabricating process according to a first embodiment of the present invention, Referring to FIG. 1A, a base layer 110 is formed on a substrate 100. The base layer 110 may include an inorganic layer, etc. Examples of a material that may be used as the base layer 110 include a metallic layer, a silicon oxide layer, a silicon nitride layer or a laminated layer of them, etc. The base layer 110 may be formed by a sputtering method or a chemical vapor deposition (CVD) method, etc.

A liquid resist composition is coated on the base layer 110 to form a resist layer 120 on the base substrate 110. The resist layer 120 may be formed by a spin coating method, a blade coating method, a spray coating method, or a roll printing method.

The resist composition may include a UV curable resin. The UV curable resin may include an organic combination having an acrylic group or a vinyl group. Examples of a material that may be used for the UV curable resin include poly methyl methacrylate PMMA resin, butyl methacrylate BMA resin, uretathan acrylate resin, poly vinyl alcohol resin, etc.

The content of the UV curable resin may be within 50 wt % to 80 wt % of the entire resist composition. When the content of the UV curable resin is less than 50 wt %, it is impossible for the resist pattern to be maintained. On the contrary, when the content of the UV curable resin is more than 80 wt %, it is difficult to apply the resist composition to the base layer 110, because the viscosity of the resist composition increases.

Further, the resist composition may include an adhesion promoter (not shown) for improving the adhesive strength between the resist layer 120 and the base layer 110. The adhesion promoter is composed of a material capable of increasing the chemical bond of the resist layer 120 and the base layer 100. Examples of a material that may be used as the adhesion promoter include an epoxy-based compound, a urethane-based compound, etc.

The content of the adhesion promoter may be within 10 wt % to 20 wt % of the entire weight of the resist composition. When the content of the adhesion promoter is less than 10 wt %, it is difficult to improve the adhesive strength between the resist layer 120 and the base layer 110. When the content of the adhesion promoter is more than 20 wt %, the shape of the resist pattern is broken.

Furthermore, the resist composition further includes an additive. The additive may include a light initiator for initiating a reaction of the UV curable resin and a coupling agent for chemically coupling the base layer 110 to the UV curable resin. Examples of a material that may be used for the initiator include a chemical compound of a-hydroxy ketone, a chemical compound of a-amino ketone, a chemical compound of phenyl blyoxylate, a chemical compound of acyl phosphine oxide, a chemical compound of benzo phenone, IRGACURE™ 369, 500, 651 or 907 (available from Ciba Specialty Chemicals Ltd.), etc. The content of the initiator may be less than 3 wt % for the entire content of the resist composition.

Examples of a material that may be used as the coupling agent include a gamma-glucidoxypropyl trimethodxy silane, a mercapto propyl trimethodxy silane, a methyl trimethoxy silane, etc.

When the base layer 110 is an inorganic film, the coupling agent chemically combines the base layer 110 with the adhesive or chemically combines the base layer 110 with the UV curable resins. That is, when adding the coupling agent into the resist composition, the adhesion strength between the base layer 110 and the resist layer may be greatly increased. The content of the coupling agent may be within 5 wt % to 10 wt % of the entire resist composition. When the content of the coupling agent is less than 5 wt %, it is not effective to increase the chemical bond between the base layer 110 and the resist layer 120. When the content of the coupling agent is more than 10 wt %, it is difficult to apply the resist composition evenly to the base layer 110 as the viscosity of the resist composition is increased.

Then, a mold 200 having a pattern is aligned to the resist layer 120 formed on the substrate 100. The pattern of mold 200 may have a concave and convex portion. Further, the mold 200 is formed with a transparent material that is capable of passing light. Examples of materials that may be used as the mold 200 include polydimethylsiloxane (PDMS), polycarbonate (PC), silicon, glass, etc.

A cleaning process for cleaning the pattern of the mold 200 may be carried out before aligning the mold 200 to the resist layer 120 because a desirable resist pattern is not formed on the resist layer 120 when the pattern of the mold 200 is contaminated by particles.

Figure 1B:
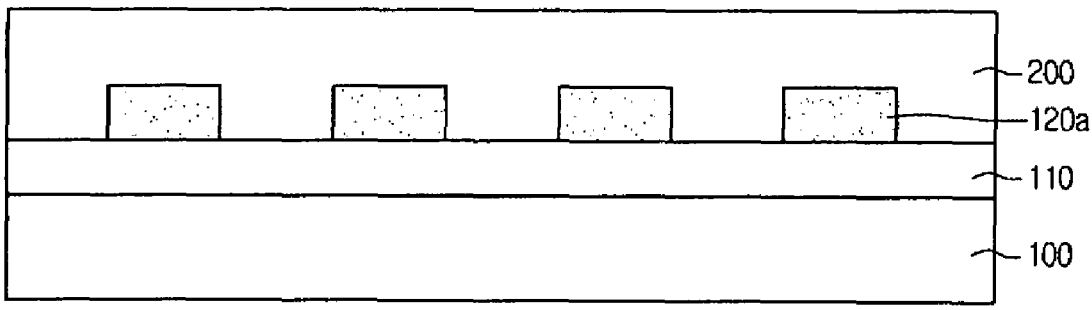
Figure 1C:
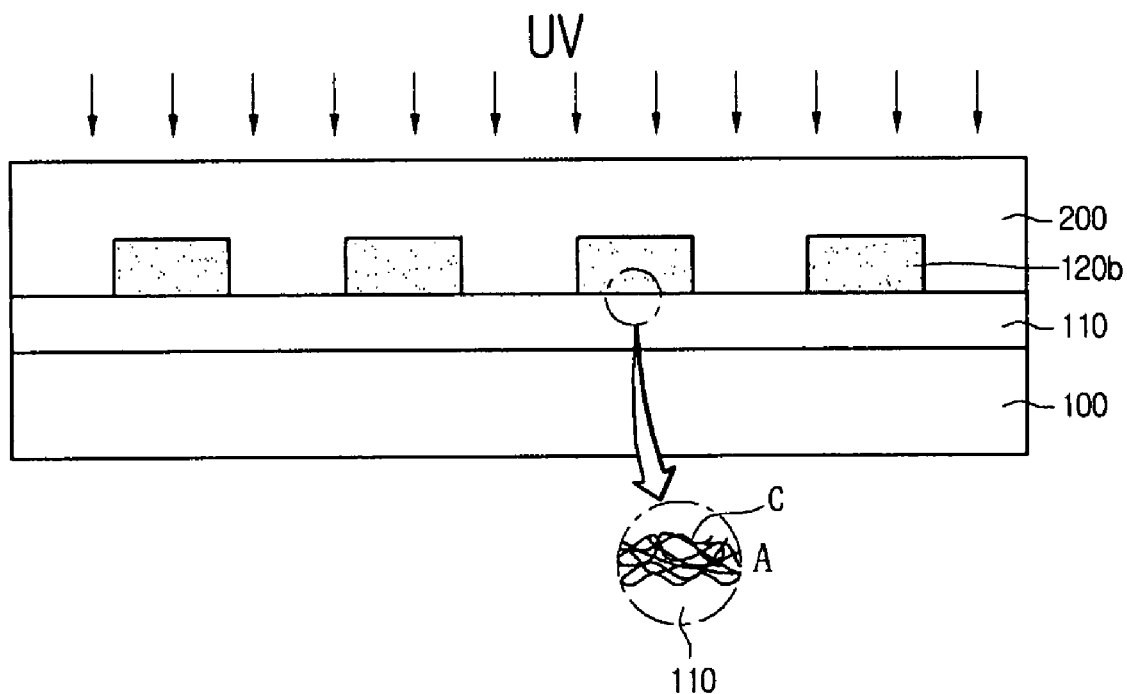

Further, when particles are attached to the pattern of the mold 200, the mold 200 is not easily separated from the resist pattern of the resist layer 120. Referring to FIG. 1B, the pattern formed on the mold 200 is imprinted on the resist layer 120 to form a preliminary resist pattern 120a thereon. To form the resist pattern 120a, the mold 200 is pressed onto the resist layer 120.

Thus, convex and concave patterns of the pattern of the mold 200 are transferred to the resist layer 120 to form the preliminary resist layer 120a on the substrate.

Although the pattern of the mold 200 is transferred to the resist layer 120 by contact of the resist layer and a mold in the present embodiment, however, it is not limited to this, and it is possible for the pattern of the mold 200 to be transferred to the resist layer 120 as applying a pressure to the mold 200.

Referring to FIG. 1 C, the preliminary resist pattern 120 is hardened by irradiating ultraviolet rays onto the preliminary resist pattern to form a resist pattern 120b on the substrate 100.

A heat treatment process is further applied to the resist pattern 120b so as to improve the adhesive strength between the resist pattern 120b and the base layer 110.

In the heat treatment process, the resist pattern 120b that includes a UV curable resin is heated at a temperature higher than the glass transition temperature (Tg). This is to improve the adhesive strength between the resist pattern 120b and the base layer 110 as moving the chains C of the UV curable resin composing the resist pattern 120b with heat and inducing a micro packing of the chains C with the base layer. That is, the surface of the base layer 110 naturally includes a multitude of peaks and depressions, and the UV curable resins also contact the peaks and depressions where the resins did not previously contact the peaks and depressions because the movement of the chains C in the UV curable resin C becomes more active during the heat treatment process.

Accordingly, the adhesive strength between the base layer 110 and the resist pattern 120b increases as the area in which the resist patterns 120 is in contact with the base layer 110 is enlarged.

Further, the heat treatment process improves the adhesion strength between the resist pattern 120b and the base layer 110 along with the chemical reaction of the adhesion promoter contained in the resist composition described above. It is possible for the heat treatment process to be performed in a chamber capable of being heated after using the UV radiation. However, the heat treatment process is not limited to the afore-mentioned instance in the present preferred embodiment. For instance, it is possible for the heat treatment process to be performed during cohering the substrate and the mold or hardening the preliminary resist pattern. That is, it is possible for the heat treatment to be performed on a substrate on which the resist layer has been formed or on a heated substrate on which the preliminary resist pattern is formed.

Figure 2:
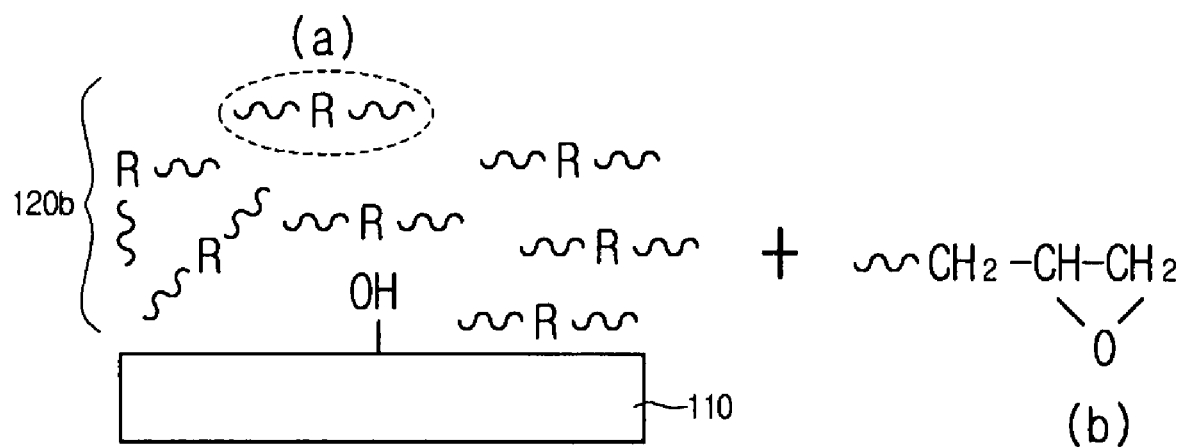
FIG. 2 is a cross-sectional view illustrating the chemical bond of the base layer with the resist layer due to an adhesion promoter according to the first embodiment of the present invention.
Figure 2:
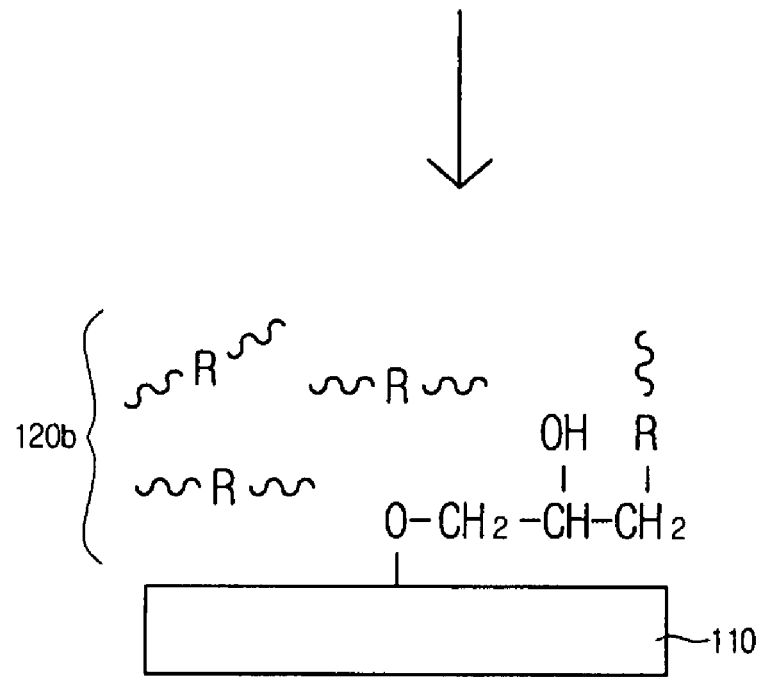

FIG. 2 is a cross-sectional view illustrating the chemical bond of the base layer with the resist layer by an adhesion promoter according to the first preferred embodiment of the present invention.

Referring to FIG. 2, because the base layer 110 is exposed to the outside, the surface of the base layer 110 has an OH group. The adhesive b contained in the resist composition reacts with the OH group so that the adhesion promoter is chemically combined with the UV curable resin included the resist pattern 120b. Accordingly, because the base substrate 110 and the resist pattern 120b are chemically coupled to each other, the adhesive strength between the base layer 110 and the resist pattern 110 may be improved. Here, because the mold 200 may be formed of hydrophilic material, the adhesive strength between the mold 200 and the resist pattern 120b is not increased, even though the adhesion promoter is contained in the resist composition. Thus, the adhesive strength between the base layer 110 and the resist pattern 120b may be greater than the adhesive strength between the mold 200 and the resist pattern 120b. Examples of a material that may be used for the adhesion promoter include an epoxy-based compound and a urethane-based compound reacted to the OH group formed on the surface of the base layer 110.

Therefore, the adhesive strength between the resist pattern 120b and the base layer 110 may be improved by the mechanical factor or chemical factor.

Figure 1D:
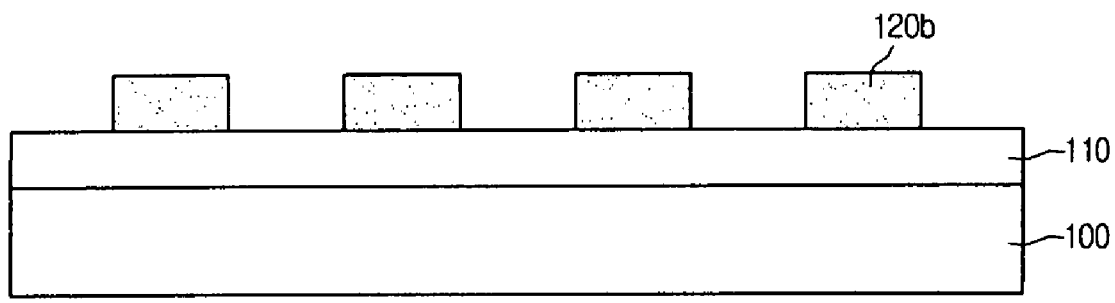

Referring to FIG. 1D, the mold 200 is separated from the resist pattern 120b. When the adhesive force between the resist pattern 120b and the base layer 110 is greater than the adhesive force between the resist pattern 120b and the mold 200, the conventional situation in which parts of the resist patterns 120b are torn off with the mold 200 while separating the mold 200 is prevented. Further, it is advantageous that excessive power is not required to separate the mold 200, and the durability of the mold is improved as the contamination of the mold 200 by parts of the resist pattern 120b is improved.

The resist pattern 120b may be used as an etching mask for etching the base layer 110. Further, the resist pattern 120b may be used as conductive wires by adding electric conductive materials to the resist pattern 120b. Furthermore, it is advantageous in that the productivity is improved as well as reducing the number of processes when indicating elements are manufactured by using the resist pattern 120b.

Reference will now be made in detail for the method of fabricating a liquid crystal display device using the above-mentioned imprint lithography.

FIGS. 3A to 3D are flowcharts illustrating a thin film transistor array substrate and the fabricating method thereof according to the second embodiment of the present invention.

Figure 3A:
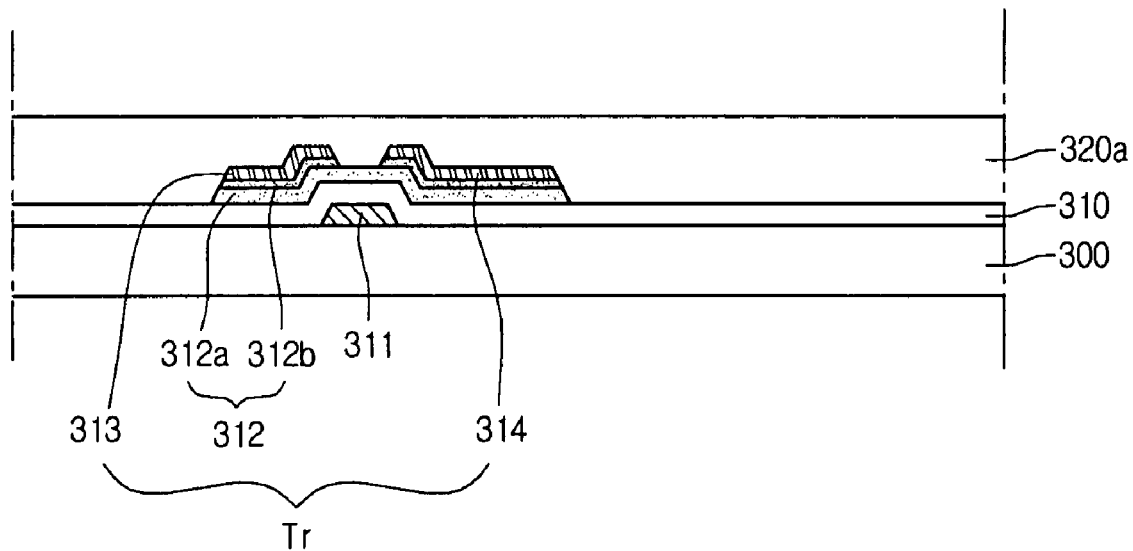
FIGS. 3A to 3D are cross-sectional views illustrating a thin film transistor array substrate and the fabricating method thereof according to the second embodiment of the present invention.

Referring to FIG. 3A, a gate line(not shown), a data line (not shown) arranged substantially perpendicular to the gate line, and a thin film transistor Tr arranged at crossing point of the gate line and the data line. The thin film transistor Tr may include a gate electrode 311 branching from the gate line, a gate insulation film 310 covering the gate electrode 311 and the gate line, a semiconductor pattern 312 disposed on the gate insulation film 310 and corresponding to the gate electrode 311, and a source/drain electrodes 313 and 314 positioned at the both ends of the semiconductor pattern 312.

Particularly, a conductive layer (not shown) is formed on the substrate 300 to form the gate electrode 311. The conductive layer may be formed by a vacuum evaporating method or a spurting method, etc. Examples of a material that may be used as the conductive layer include aluminum AL, molybdenum MO, tungsten-molybdenum MoW, tantalum-molybdenum MoTa, niobium molybdenum MoNb, chrome Cr, tungsten W, niobium aluminum AlNb, etc.

A resist pattern is formed on the conductive layer after forming the conductive layer. The resist pattern may be formed by the imprint lithography process. In order to form the resist pattern, a resist composition is coated on the conductive layer to form a resist layer. A preliminary resist pattern is formed by transcribing the pattern of the mold on the resist layer by conformally contacting the gate electrode 311 and a mold patterned in the shape of the gate line to the resist layer. Then, the resist pattern is formed by hardening the preliminary resist pattern by radiating UV light toward the preliminary resist pattern in the mold. After that, the mold is separated from the resist pattern. Here, the resist composition may include a UV curable resin, adhesion promoter, an additive, etc.

A gate electrode 311 and a gate line are formed on the substrate 300 after etching the conductive layer with the resist pattern as an etching mask and removing the resist pattern.

A gate insulation layer 310 is formed on an entire surface of the substrate to cover the gate electrode 311 and the gate line with the gate insulation layer 310. The gate insulation layer 310 may include a silicon oxide layer or a silicon nitride layer or a laminated layer of the two layers. Here, the gate insulation layer 310 may be formed by a chemical vapor deposition method or a spurting method, etc.

A semiconductor pattern 312 formed on the gate insulation layer 310 corresponding to the gate electrode 311 and a source/drain electrode 313 and 314 positioned at the both ends of the semiconductor pattern 312 are sequentially formed on the substrate, thereby forming the thin film transistor Tr. Here, the semiconductor pattern 312 may include an active layer 312a and an ohmic contact layer 312b. The active layer 312a is formed with an amorphous silicon pattern, and the ohmic contact layer 312b is formed with an amorphous silicon pattern doped with impurities.

The source/drain electrode 313 and 314 may be formed by patterning after forming a single or doubled layered film. Examples of a material that may be used as the source/drain electrode 313 and 314 include Mo, Ti, Ta, MoW, Mota, MoNb and an alloy of them, etc. In order to form the source/drain electrode 313 and 314, a resist pattern that is formed by an imprint lithography process or a photolithography process is formed on a source/drain layer and then the source/drain layer is patterned using the resist pattern as an etching mask to form the source/drain electrodes 313 and 314 and a semiconductor layer formed below the source/drain electrodes 313 and 314 is etched using the source/drain electrodes 313 and 314 to form the semiconductor pattern 312 on the gate insulating layer 310. Thus, the thin film transistor Tr is formed on the substrate hereby.

After forming the thin film transistor Tr, a passivation material is coated on the substrate having the thin film transistor Tr to form a passivation layer 320a on the substrate. That is, the passivation layer 320a is formed on the gate insulation film 310 to cover the source/drain electrode 313 and 314.

Here, the passivation layer 320a may be formed by a spin coating method, a deep coating method, a roll coating method, a bar coating method, a screen printing method, an inkjet printing method, a blade method, etc.

Here, the passivation layer composition includes a UV curable resin and an adhesion promoter.

Examples of a material that may be used as the UV curable resin include a novolak resin, an acrylic resin, polyimide resin, a polyamide resin, polymethyl methacrylate PMMA resin, butyl methacrylate BMA resin, urethane acrylate resin, poly vinyl alcohol resin, etc. Here, the content of the UV curable resin is within 50 wt % to 80 wt % of the entire weight of the overcoat composition to maintain the shape of a passivation pattern 320 to be described later.

The adhesion promoter increases the adhesive strength between gate insulation layer 310 including the thin film transistor Tr and the passivation pattern 320. Examples of a material that may be used as the adhesion promoter include an epoxy-based compound or a urethane-based compound. Here, the content of the adhesive is within 10 wt % to 20 wt % of the entire weight of the overcoat composition to strengthen the adhesive strength between the insulation film 310 and the passivation pattern 320 and to preserve the shape of the passivation pattern 320.

In addition, the passivation layer 320a composition may further include an additive. The additive may be a light initiator or a coupling agent. Here, Examples of a material that may be used as the light initiator include an a-hydroxy ketone combination, an a-amino ketone combination, a phenyl glyoxylate combination, acryl phosphine oxide combination, benzon phenone, IRGACURE™ 369, 500, 651 and 907 (available from Ciba Specialty chemicals Ltd.). Here, the content of the light initiator may be less than 3 wt % of the entire weight of the overcoat composition.

Examples of a material that may be used for the coupling agent include a gamma-glicidoxyptopyl trimethoxy silane, a mercapto propyl trimethoxy silane, a methyl trimethoxy silane, etc.

The coupling agent performs a roll inducing the chemical bond of the gate insulation layer 310 composed of inorganic combination and the passivation pattern 320 composed of organic combination. The adhesion strength between the gate insulation film 310 and the passivation pattern 320 is increased hereby by adding the coupling agent into the passivation layer composition.

Figure 3B:
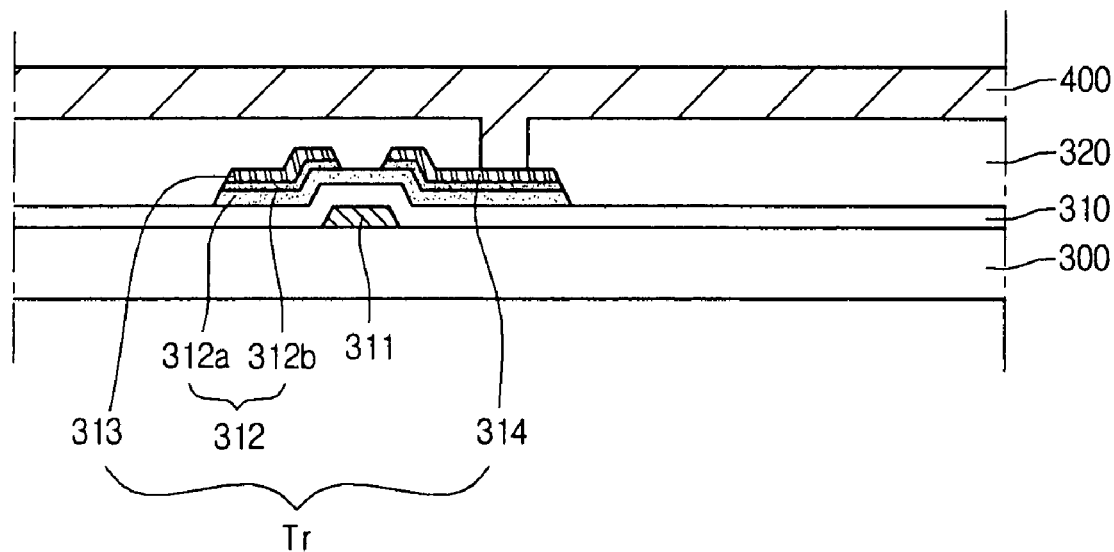

Referring to FIG. 3B, a pattern of the mold 400 is imprinted on the passivation layer 320a by contacting the mold 400 having a predetermined pattern to the surface of the passivation layer 320a. The pattern of the mold 400 may be imprinted by compressing a mold 400 having a predetermined pattern to the passivation layer 320a.

A preliminary passivation pattern has a contact hole exposing a part of the drain electrode of the thin film transistor Tr.

Ultraviolet rays are irradiated onto the preliminary passivation pattern to form a hardened passivation pattern 320.

A heat treatment process is applied to improve the adhesive strength between the gate insulation layer 310 and the passivation pattern 320. The heat treatment process applies heat higher than the glass transferring temperature of the UV curable resin to the passivation pattern 320.

Figure 3C:
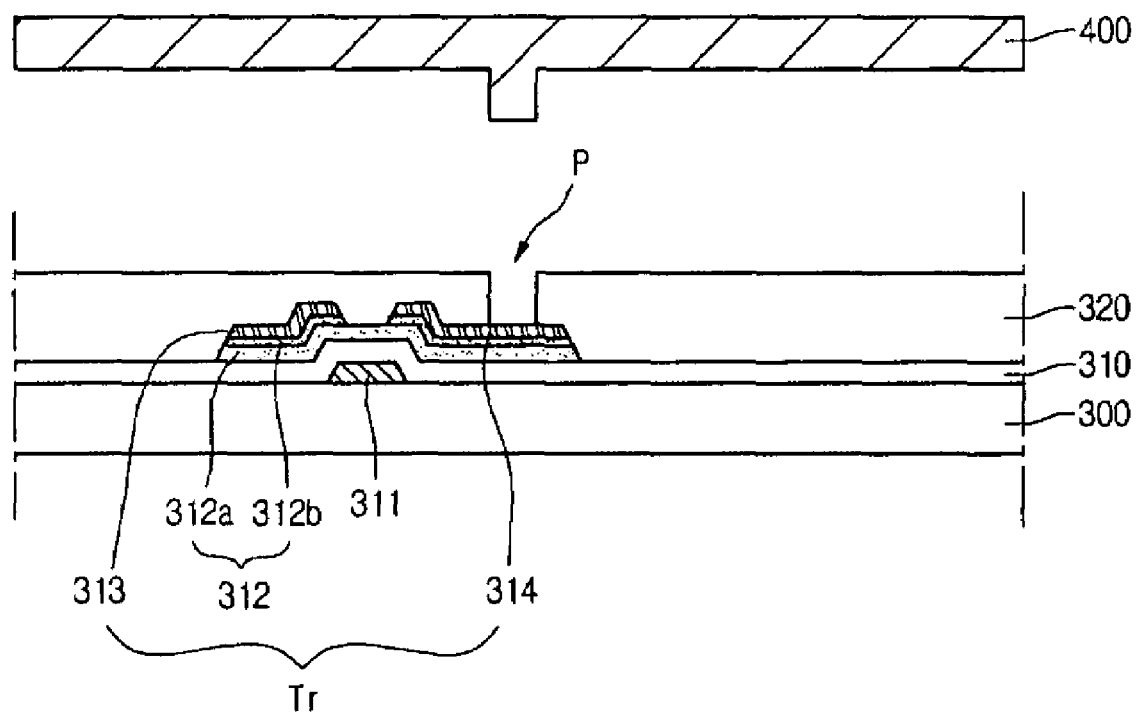

Referring to FIG. 3C, the mold 400 is separated from the passivation pattern 320. The contact hole P is formed in the area corresponding to the projection of the mold 400.

Here, the mold 400 is desirably separated from the passivation pattern 320 by improving the adhesive strength between the mold 400 and the passivation pattern 320 by including an adhesion promoter into the composition to form the passivation pattern 320 and performing the heat treatment process.

Figure 3D:
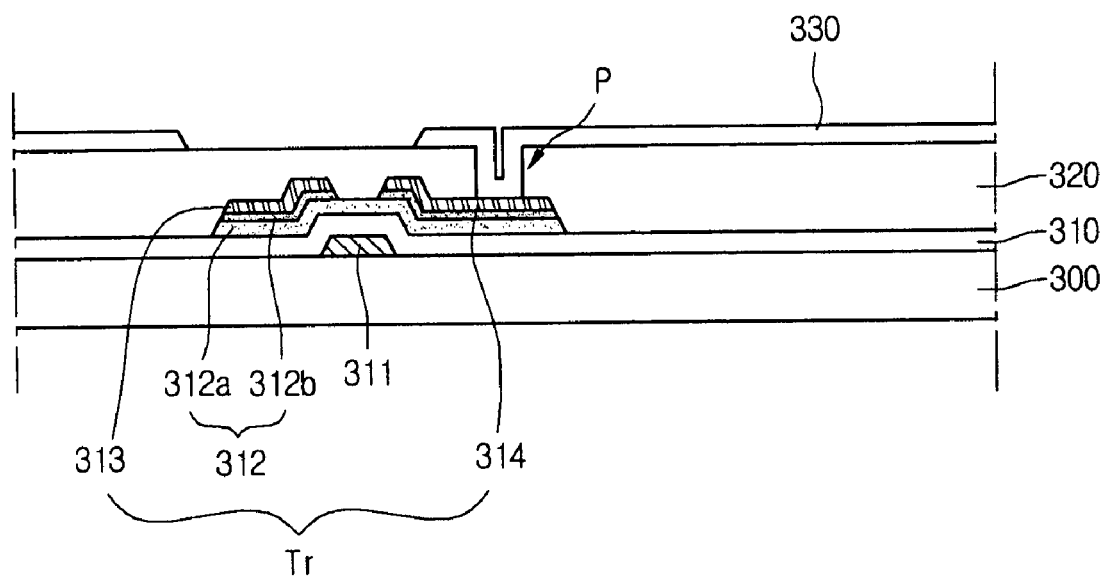

Referring to FIG. 3D, a pixel electrode 330 electrically connected to the drain electrode exposed through the contact hole P is formed. Here, the pixel electrode 330 is formed by patterning the conductive layer in accordance with the resist pattern after forming the conductive layer and the resist pattern one after another on the passivation pattern 420 to form the pixel electrode 330. Here, the resist pattern may be formed by the above-described imprint lithography process or a photo lithography process.

Figure 4A:
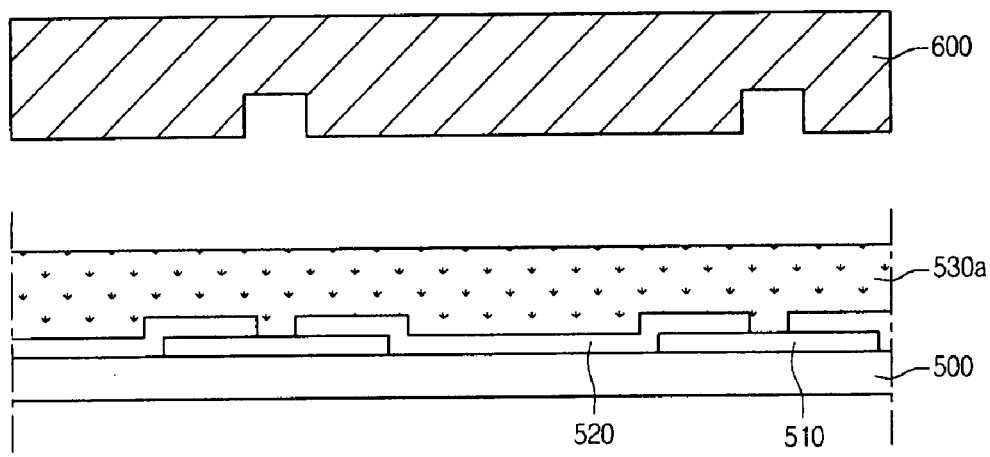
FIGS. 4A to 4C are cross-sectional views illustrating the color filter array substrate and the fabricating method thereof according to the third embodiment of the present invention.
Figure 4B:
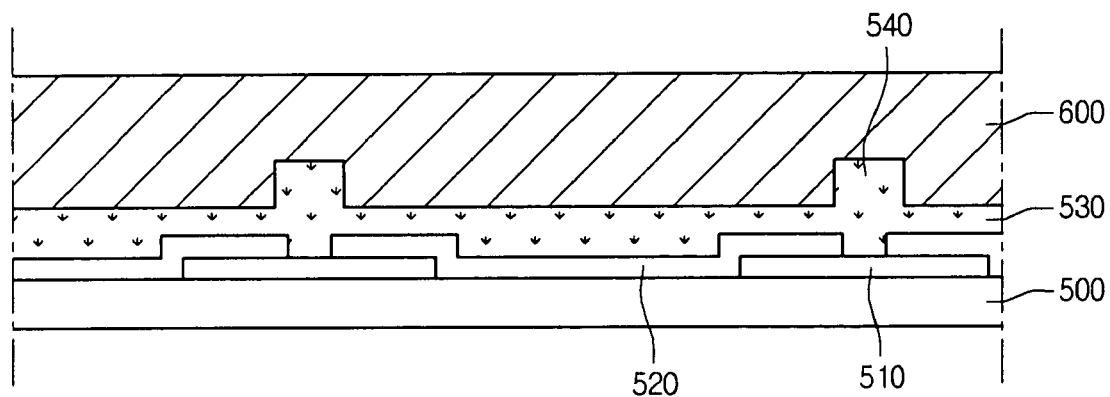
Figure 4C:
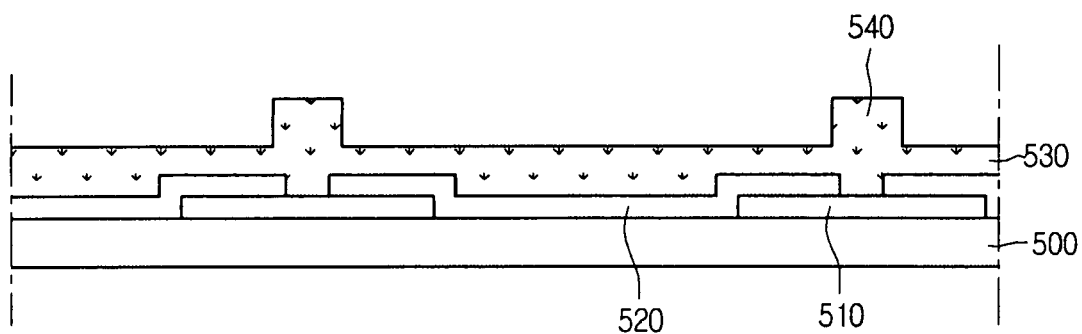

FIGS. 4A to 4C are cross-sectional views illustrating the color filter array substrate and the fabricating method thereof according to the third embodiment of the present invention.

Referring to FIG. 4A, a substrate 500 is provided. A black matrix 510 and a color filter layer 520 are formed on the substrate 500.

Particularly, a black matrix 510 is formed by the patterning process after forming an opaque metal film including chrome or a resin film over the substrate. Here, the patterning process may be performed by the above-mentioned imprinting lithography process or the photo lithography process.

Here, the several sub-pixels may be defined by the black matrix 510. A color filter layer 520 is formed at the several pixels defined by the black matrix 510 hereby. Here, the color filter layer 520 is formed through the inkjet printing method or is formed through the photo lithography process after applying the resin for forming the color filter all over the substrate including the black matrix 510.

Here, an overcoat layer 530a is formed on the black matrix 510 and the color filter layer 520 by applying the resist composition to overcome the gap generated between the black matrix 510 and the color filter layer 520.

Here, a spin coating method, a deep coating method, a roll coating method, a bar coating method, a screen printing method, an inkjet printing method, a blade method and so on are the examples of the method for fabricating the overcoat layer 530a.

The composition for fabricating the overcoat layer 530a includes a UV curable resin and adhesion promoter.

Here, an acrylic resin, polyimide resin, a polyamide resin, a novolak resin, poly metyl methacrylate PMMA resin, butyl methacrylate BMA resin, urethane acrylate resin and poly vinyl alcohol resin may be used as the UV curable resin. The content of the UV curable resin is within 50 wt % to 80 wt % of the entire weight of the composition for the overcoat layer 530a to maintain the shape of an overcoat pattern to be described later.

The adhesion promoter improves the adhesion strength between at least one of black the matrix 510 and the color filter layer 520 and the overcoat pattern 530. It is possible for the adhesion promoter to be one of an epoxy-based compound or a urethane-based compound. Here, the content of the adhesion promoter is within 10 wt % to 20 wt % of the entire content of the composition to improve the adhesive strength between at least one of the black matrix 510 and the color filter 520 and the overcoat pattern 530 and to preserve the shape of the overcoat pattern 530.

The composition further includes an additive. The additive may be a light initiator or a coupling agent. Here, a-hydroxy ketone combination, an amino ketone combination, phenyl glyoxylate combination, acryl phosphine oxide combination, benzo phenone, IRGACURE™ 369, 500, 651 and 907 (available from Ciba Specialty chemicals Ltd.) and so on are examples of an initiator. Here the content of the initiator is less than 3 wt % of the composition.

A gamma-glicidoxyptopyl trimethoxy silane, a mercapto propyl trimethoxy silane, a methyl trimethoxy silane and etc, are examples of the coupling agent. The coupling agent performs a roll inducing the chemical bond of the black matrix 510 including an inorganic combination and the overcoat pattern 530 composed of organic combination.

A mold 600 with a predetermined pattern is supplied on the overcoat layer 530a. Here, the pattern of mold 600 may have a concave and convex portion.

Referring to FIG. 4B, the pattern of the mold 600 is imprinted on the overcoat layer 530 by compressing the mold 600 or by contact of the overcoat layer 530 and the mold 600 after aligning the mold 600 over the overcoat layer 530. Here, a part of the overcoat layer 530 corresponding to the convex portion of the mold 600 is moved to depression in concave portion of the mold 600 and some of the overcoat layer 530 remains on the area corresponding to the convex portion of the mold 600. A preliminary overcoat pattern with a protrusion 540 is formed hereby.

Next, an overcoat pattern 530 with protrusion 540 formed by the overcoat pattern 530 is hardened by the radiated UV light from the mold 600 to the preliminary overcoat pattern.

A heat treatment process is applied to the substrate 300 on which the mold 600 is cohered to improve the adhesive strength between at least one of the black matrix 510 and color filter layer 520 and the overcoat pattern 530.

Referring to FIG. 4c, the mold 600 is separated from the overcoat pattern 530. Here, the protrusion 540 is formed as the overcoat composition moves into the depression of the mold 600 illustrated in FIG. 4b is hardened. The protrusion 540 is formed in a single structure with the overcoat pattern 530.

The adhesive strength between the overcoat pattern and at least one of black matrix 510 and color filter layer 520 increases by including the adhesion promoter in the overcoat pattern 530 and applying the heat treatment process. Thus, the mold 600 is desirably separated from the overcoat pattern 530.

Figure 5:
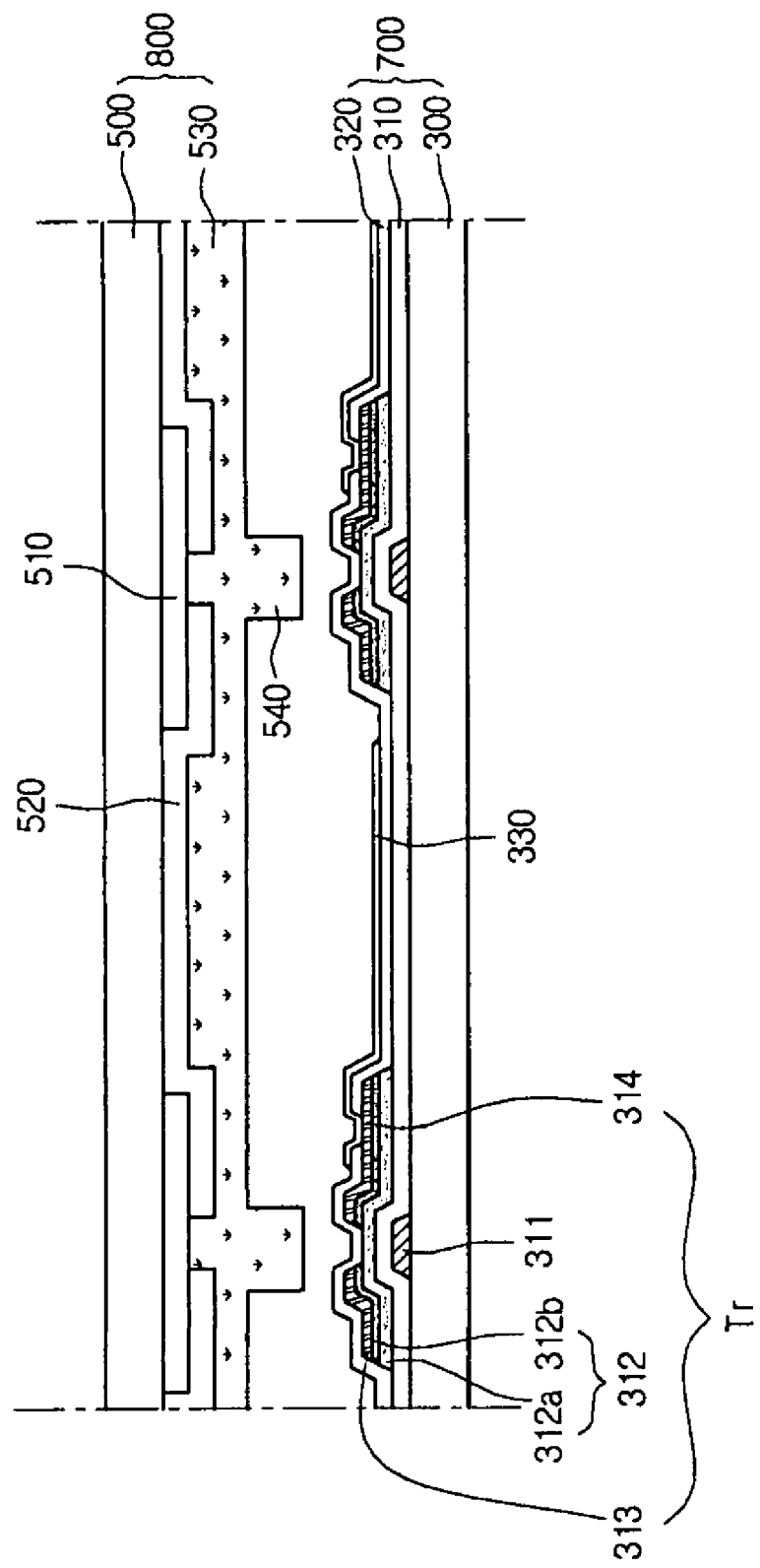
FIG. 5 is a cross-sectional view illustrating a liquid crystal panel according to the fourth embodiment of the present invention.

FIG. 5 is a cross-sectional view illustrating a liquid crystal panel according to the fourth preferred embodiment of the present invention.

Here, the liquid crystal panel is formed by combing the thin film transistor array substrate according to the second preferred embodiment and the color filter array substrate according to the third preferred embodiment. In FIG. 5 the same referential numerals designating the same components and the repeated description are omitted.

Referring to FIG. 5, a sealant pattern is formed at the outer surface of the thin film transistor array substrate 700 or the color filter array substrate 800. Then, a liquid crystal layer is formed after combing the two substrates. It is also possible to combine the color filter array substrate 800 after dropping the liquid crystal on the thin film transistor array substrate 700 before combing the two substrates. The process forming the liquid crystal layer is not limited.

It is possible for the protrusion formed on the overcoat pattern 530 to be a spacer regularly maintaining the cell gap between the thin film transistor array substrate 700 and the color filter array substrate 800.

In the related art, a pattering process required several photo lithography process, however, it is possible for the process to be simplified by replacing the photo lithography process with an imprinting lithography process.

Further, a resist pattern of high resolution is obtained by preventing the resist pattern from remaining on the mold while removing the mold in the imprinting lithography process. As a result, it is possible to form a minute and highly detailed pattern in the resist.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A method of forming resist pattern comprising:
   forming a resist layer including a UV curable resin, an adhesion promoter, a coupling agent and optionally a light initiator on a substrate;
   applying a mold with a predetermined pattern to the resist layer;
   forming a preliminary resist pattern, wherein the predetermined pattern of the mold is transcribed onto the resist layer;
   forming a resist pattern by hardening the preliminary resist pattern using ultraviolet rays; heating the resist pattern at a temperature higher than a glass transition temperature to move chains of the UV curable resin and for chemically coupling the adhesion promoter and the substrate; and separating the mold from the resist pattern;

wherein a surface of the base layer has an OH group that reacts with the adhesive promoter by the heating, and the mold is formed of hydrophilic material ~wherein the adhesion promoter is one of an epoxy-based compound or an urethane-based compound, wherein a content of the adhesion promoter is about 10 wt % to about 20 wt % of the entire content of the resist composition, wherein the coupling agent is at least one of a gamma-glycidoxypropyl trimethoxy silane, a mercapto propyl trimethoxy silane and a methyl trimethoxy silane, and wherein a content of the coupling agent is within 5 wt % to 10 wt % of the entire resist composition.

2. The method of forming resist pattern according to claim 1, wherein UV light is radiated onto the mold and onto the resist pattern when hardening the preliminary resist pattern.

3. The method of forming resist pattern according to claim 1, wherein heating the resist pattern is performed in a chamber.

4. The method of forming resist pattern according to claim 1, wherein the substrate on which the resist layer is formed is arranged on a heated stage when applying the mold with the predetermined pattern to the resist layer.

5. The method of forming resist pattern according to claim 1, wherein the substrate on which the preliminary resist pattern is formed is positioned on a heated stage when hardening the preliminary resist pattern.

* * * * *